(12) United States Patent
Matsuura

(10) Patent No.: US 7,408,611 B2
(45) Date of Patent: Aug. 5, 2008

(54) ELECTRONIC APPARATUS WITH A WIRING TERMINAL

(75) Inventor: Noriyoshi Matsuura, Nishinomiya (JP)

(73) Assignee: TPO Hong Kong Holding Limited, Taipei (TW)

( * ) Notice: Subject to any disclaimer, the term of this patent is extended or adjusted under 35 U.S.C. 154(b) by 0 days.

(21) Appl. No.: 10/566,549

(22) PCT Filed: Jul. 26, 2004

(86) PCT No.: PCT/IB2004/051285

§ 371 (c)(1),
(2), (4) Date: Sep. 21, 2006

(87) PCT Pub. No.: WO2005/010599

PCT Pub. Date: Feb. 3, 2005

(65) Prior Publication Data

US 2007/0035688 A1 Feb. 15, 2007

(30) Foreign Application Priority Data

Jul. 29, 2003 (WO) .................. PCT/IB03/03385

(51) Int. Cl.
*G02F 1/1335* (2006.01)
(52) U.S. Cl. .................. 349/149; 349/147; 349/152; 349/148
(58) Field of Classification Search .................. 349/149, 349/139, 152
See application file for complete search history.

(56) References Cited

U.S. PATENT DOCUMENTS 6,169,593 B1 * 1/2001 Kanaya et al. .............. 349/187

* cited by examiner

*Primary Examiner*—Frank G Font
*Assistant Examiner*—Michael P Mooney
(74) *Attorney, Agent, or Firm*—Venable LLP; Raymond J. Ho

(57) ABSTRACT

An object of the invention is to provide a terminal structure which can reduce a connection resistance and prevent corrosion and to provide an electronic apparatus based on the terminal structure. An electronic apparatus comprising a transparent conductive layer (10) supported by a substrate (8) and a metal layer (20) of a material having a resistivity lower than that of the transparent conductive layer (10), the metal layer (20) being extended on the transparent conductive layer (10), the transparent conductive layer (10) having an oxidation resistivity higher than that of the metal layer (20) and forming a terminal (10T) for connecting to peripheral circuitry (50). The metal layer (20) extends on an extending portion (10L) of the transparent conductive layer (10) outside the terminal (10T) of the transparent conductive layer (10), and/or on the periphery of or in the vicinity of a coupling area (11) for making the transparent conductive layer (10) to be exposed to the exterior within an area of the terminal (10T) of the transparent conductive layer (10). There is provided an electrically insulating layer (30) which covers at least a part of the terminal (10T) of the transparent conductive layer (10) and the whole of the metal layer (20) and which extends on the area other than the coupling area (11) within the area of the terminal (10T) of the transparent conductive layer (10).

7 Claims, 10 Drawing Sheets

[Fig. 1]
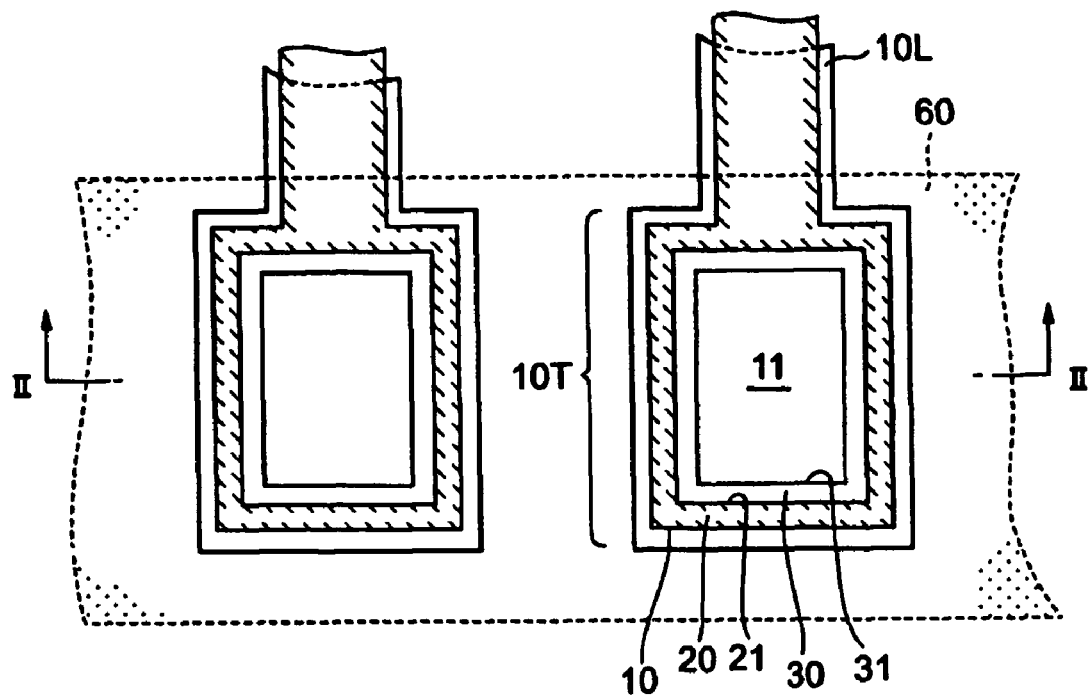
[Fig. 2]
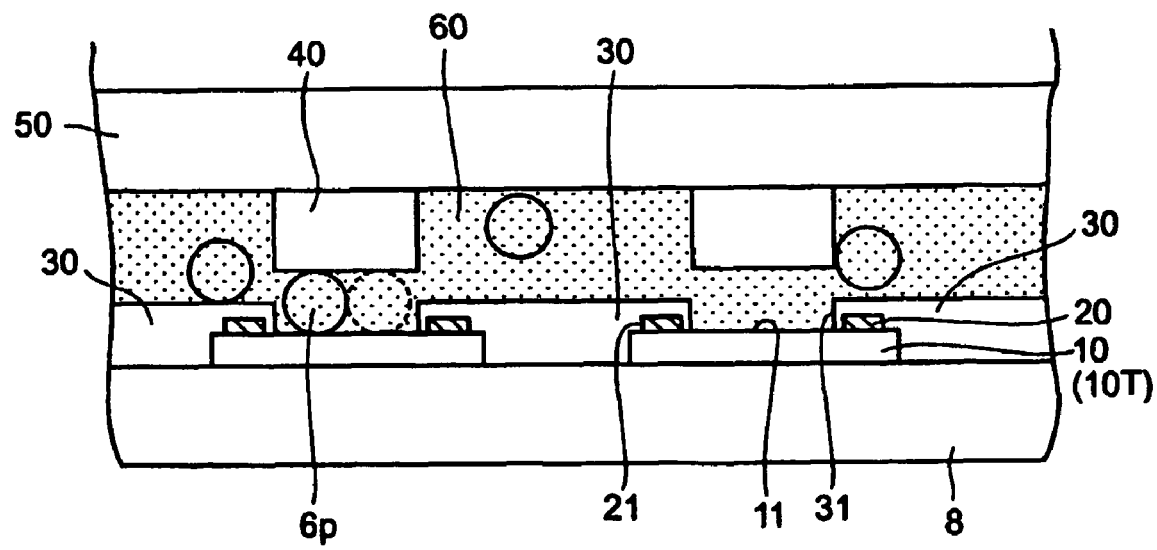

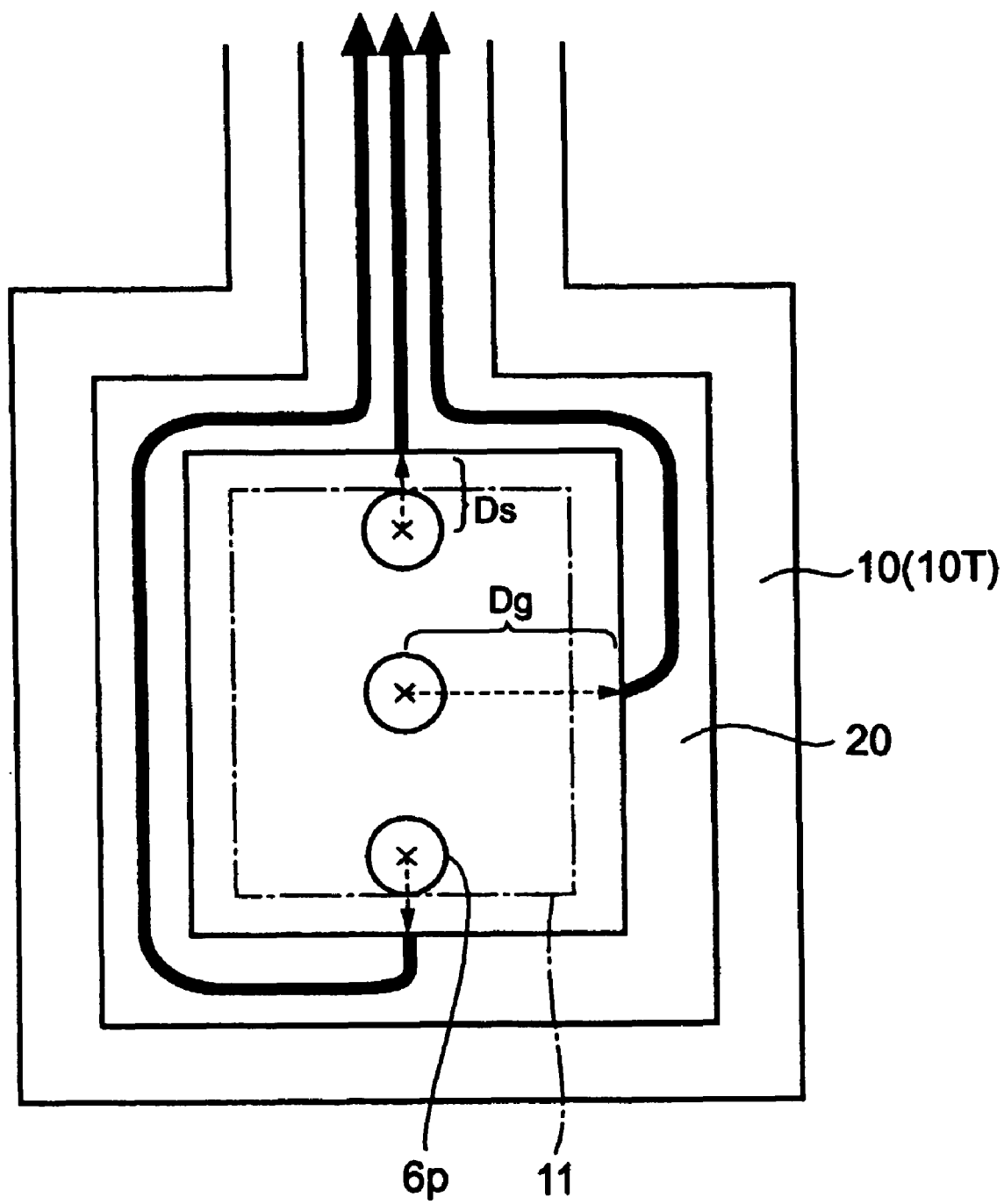
[Fig. 3]

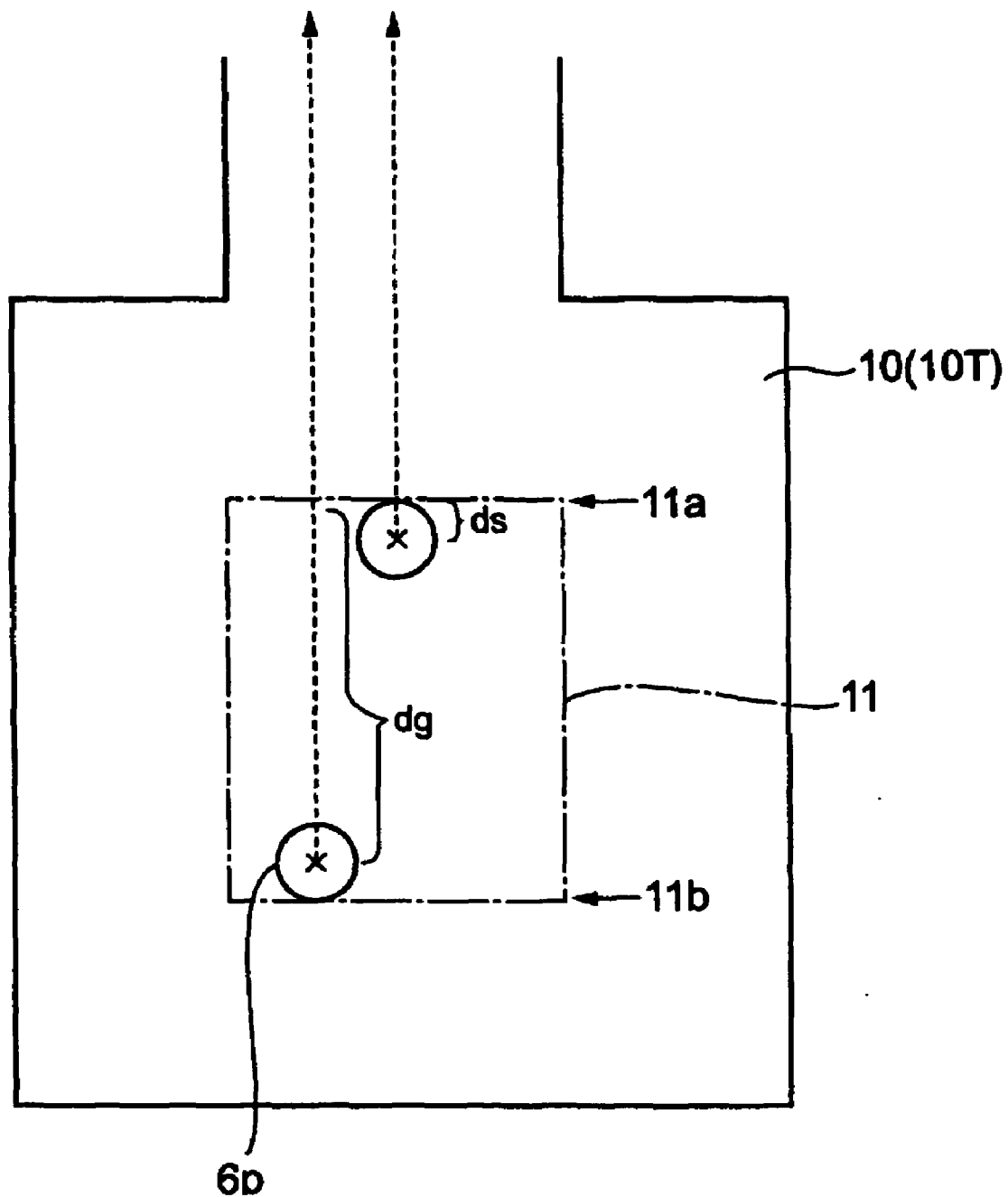
[Fig. 4]

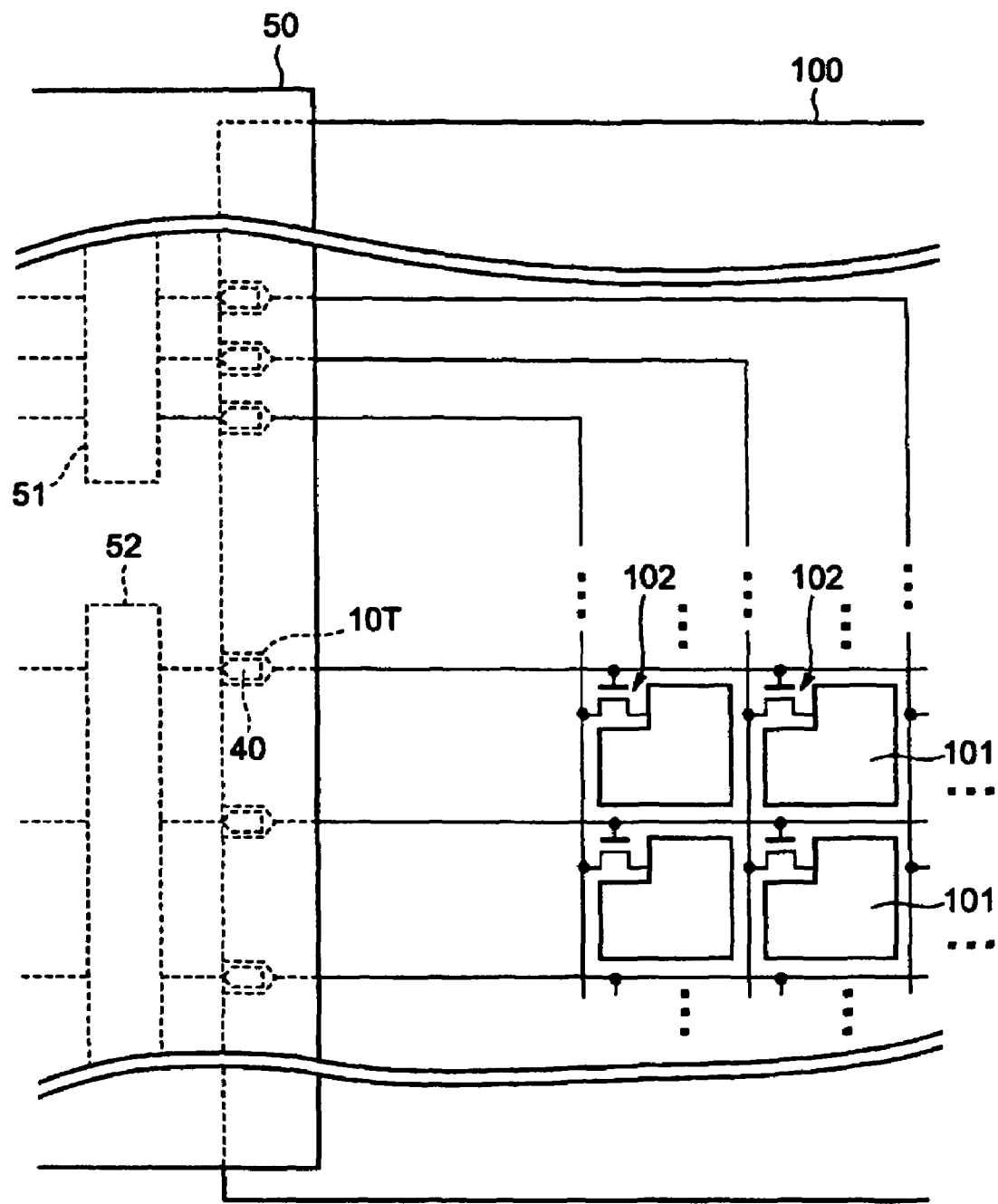

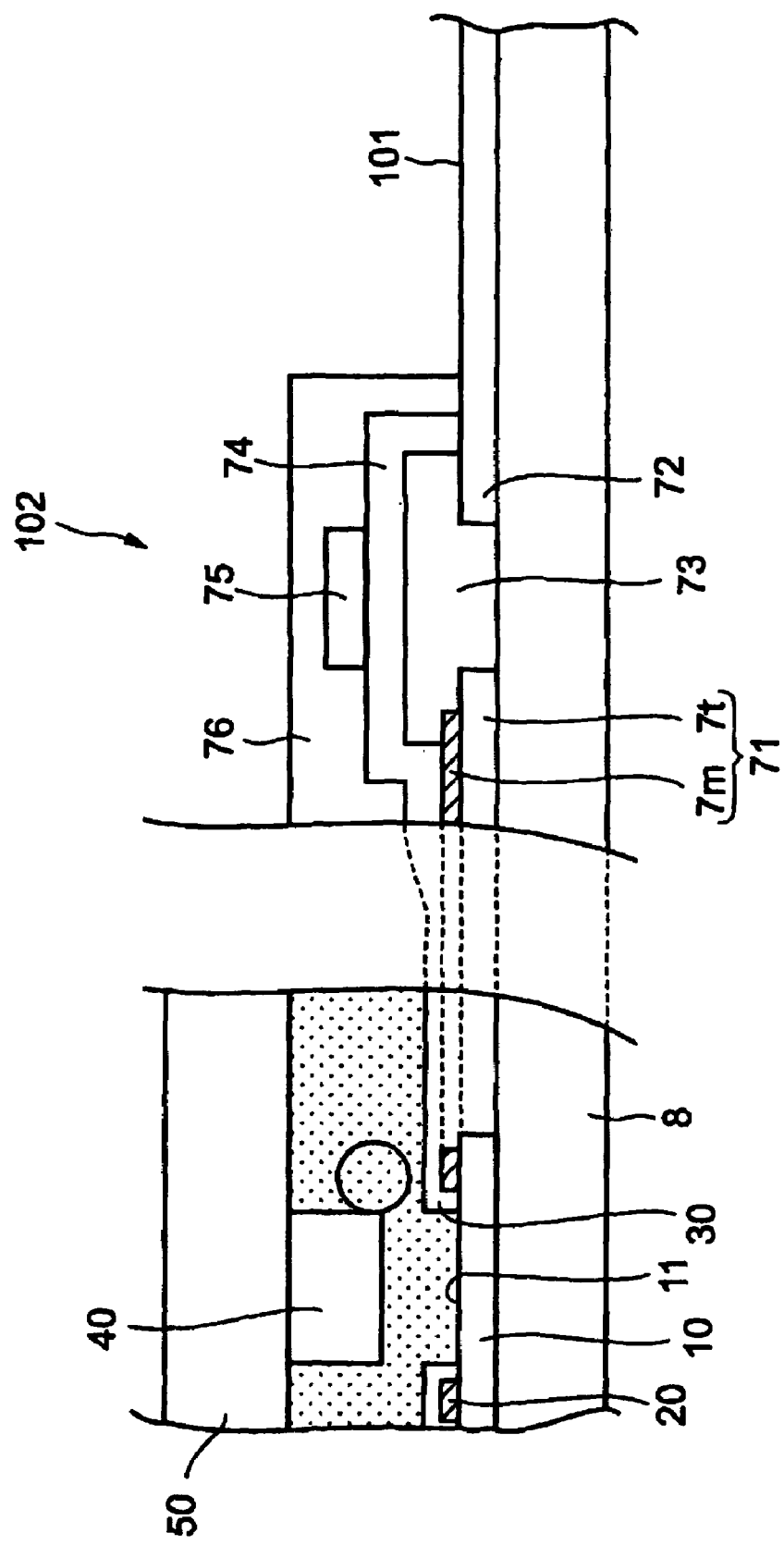
[Fig. 6]

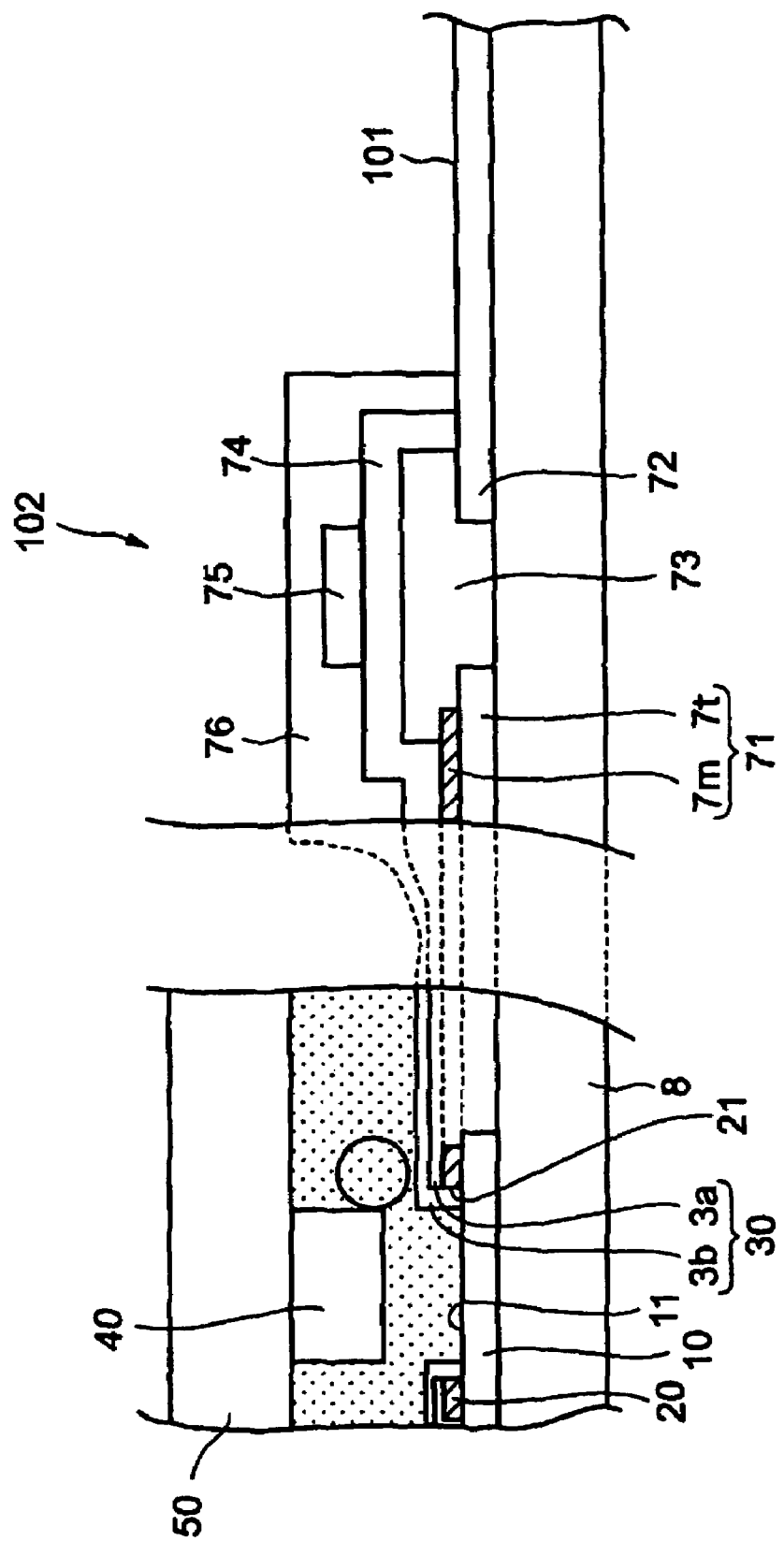
[Fig. 7]

[Fig. 8]
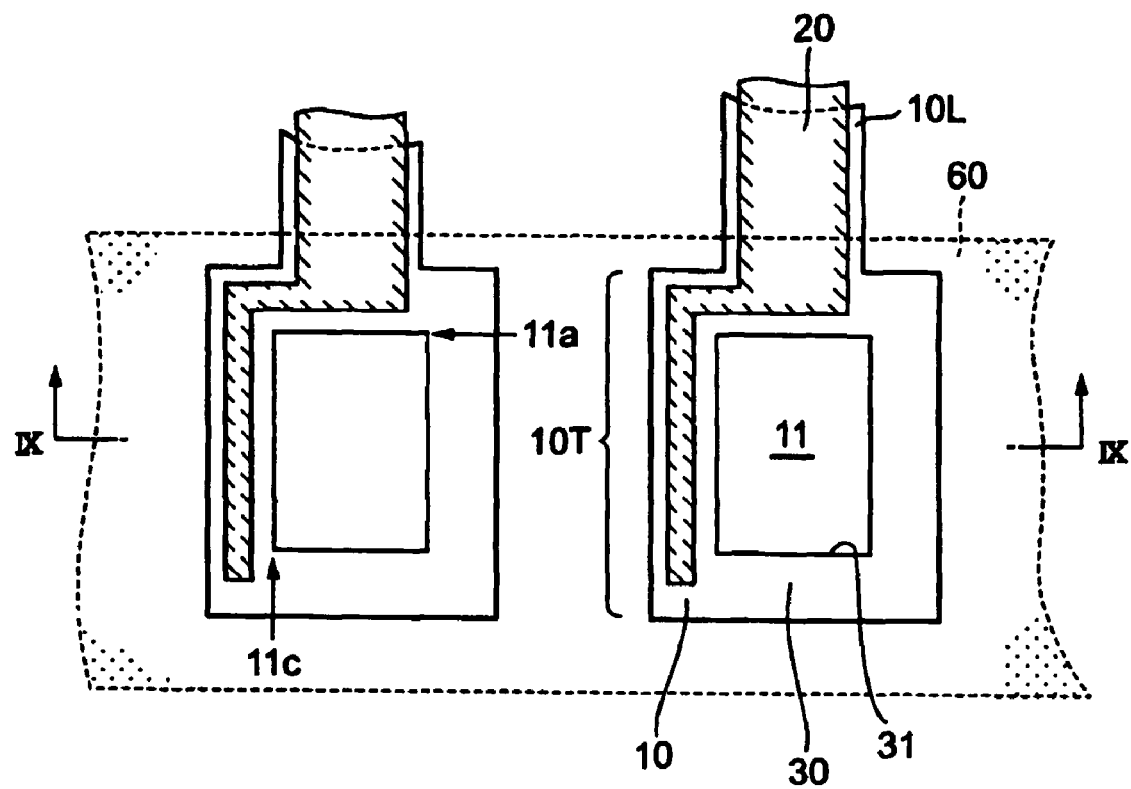
[Fig. 9]
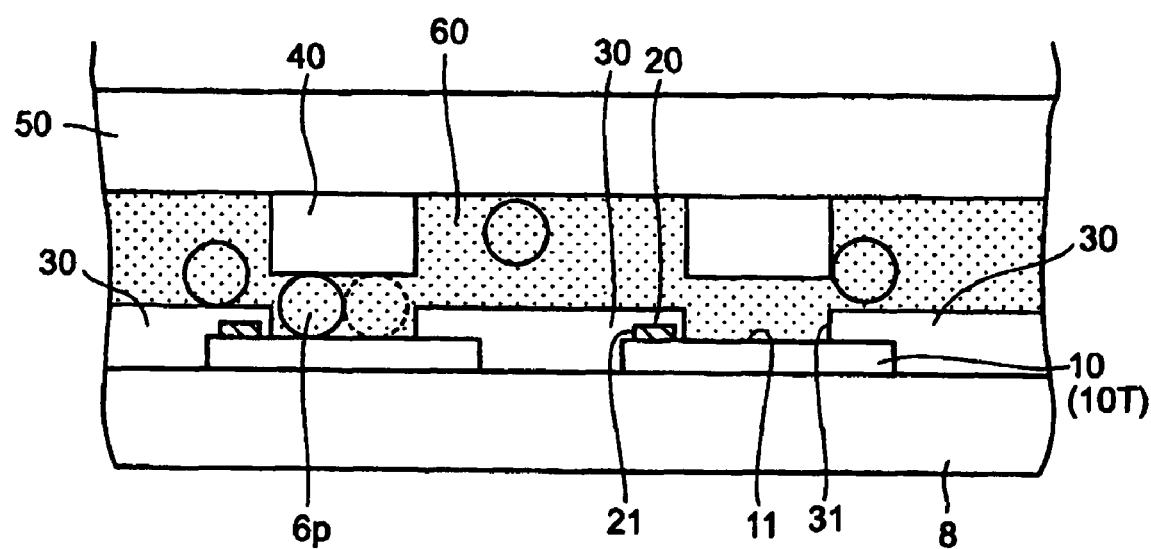

[Fig. 10]
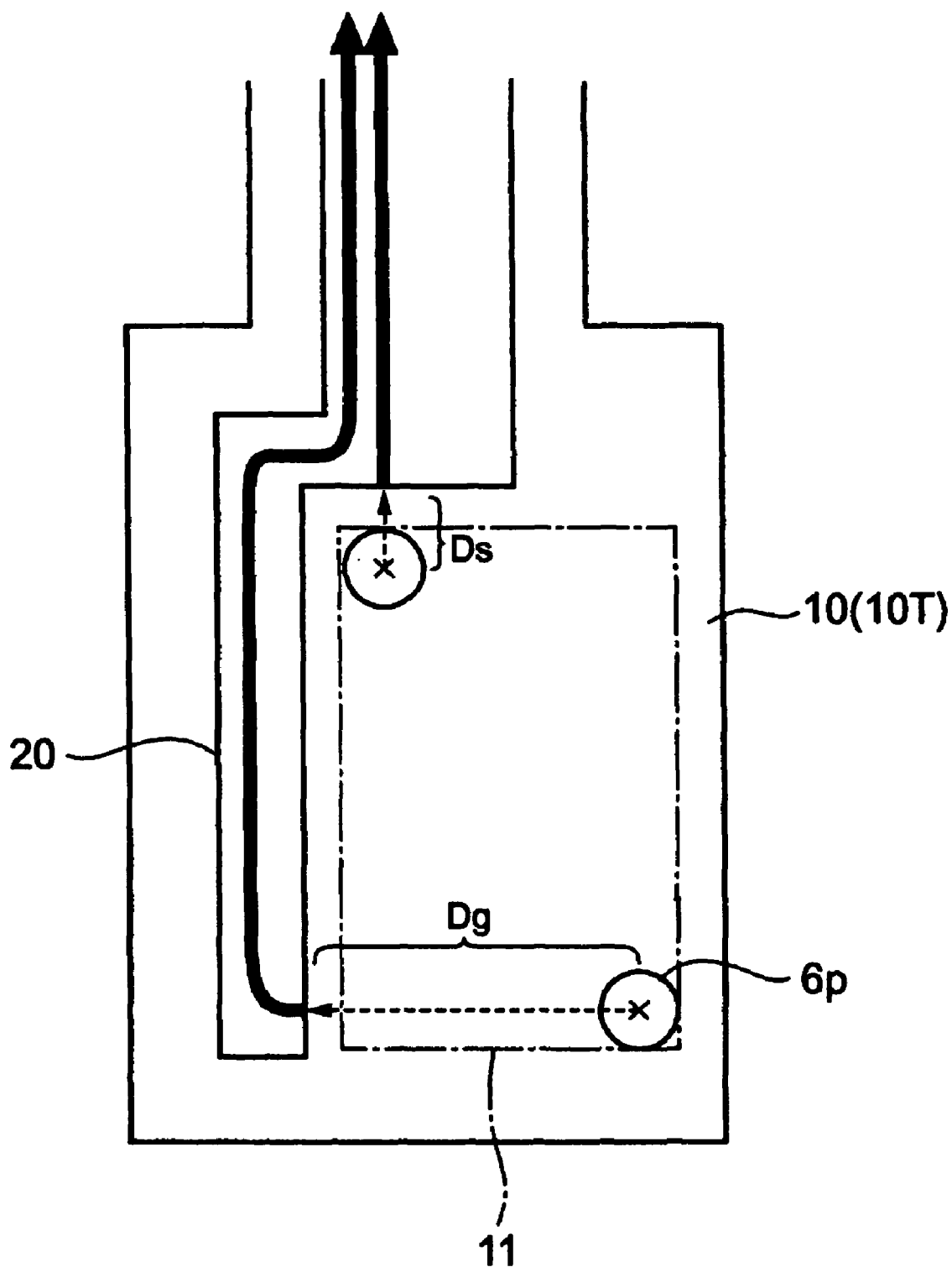

[Fig. 11]
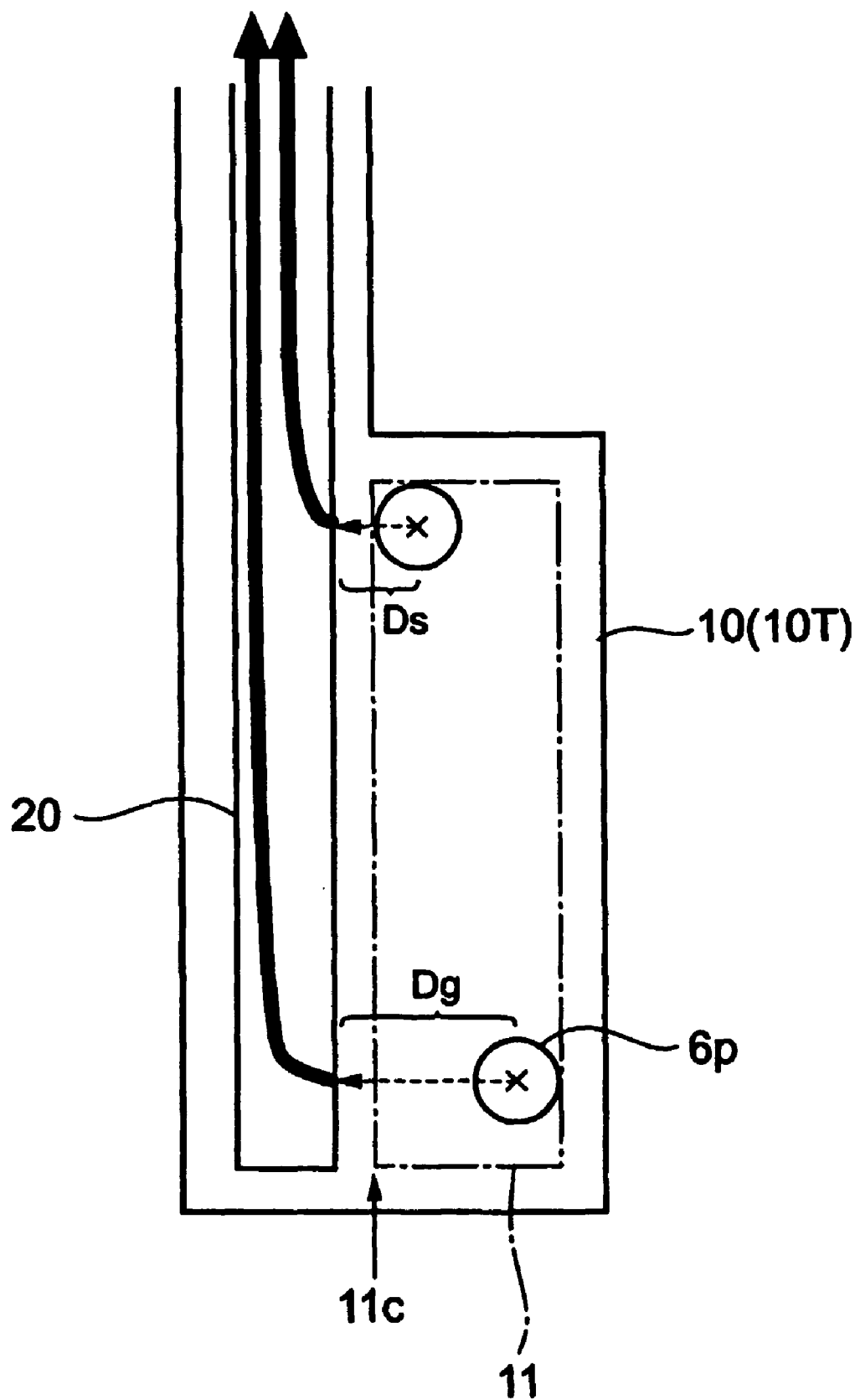

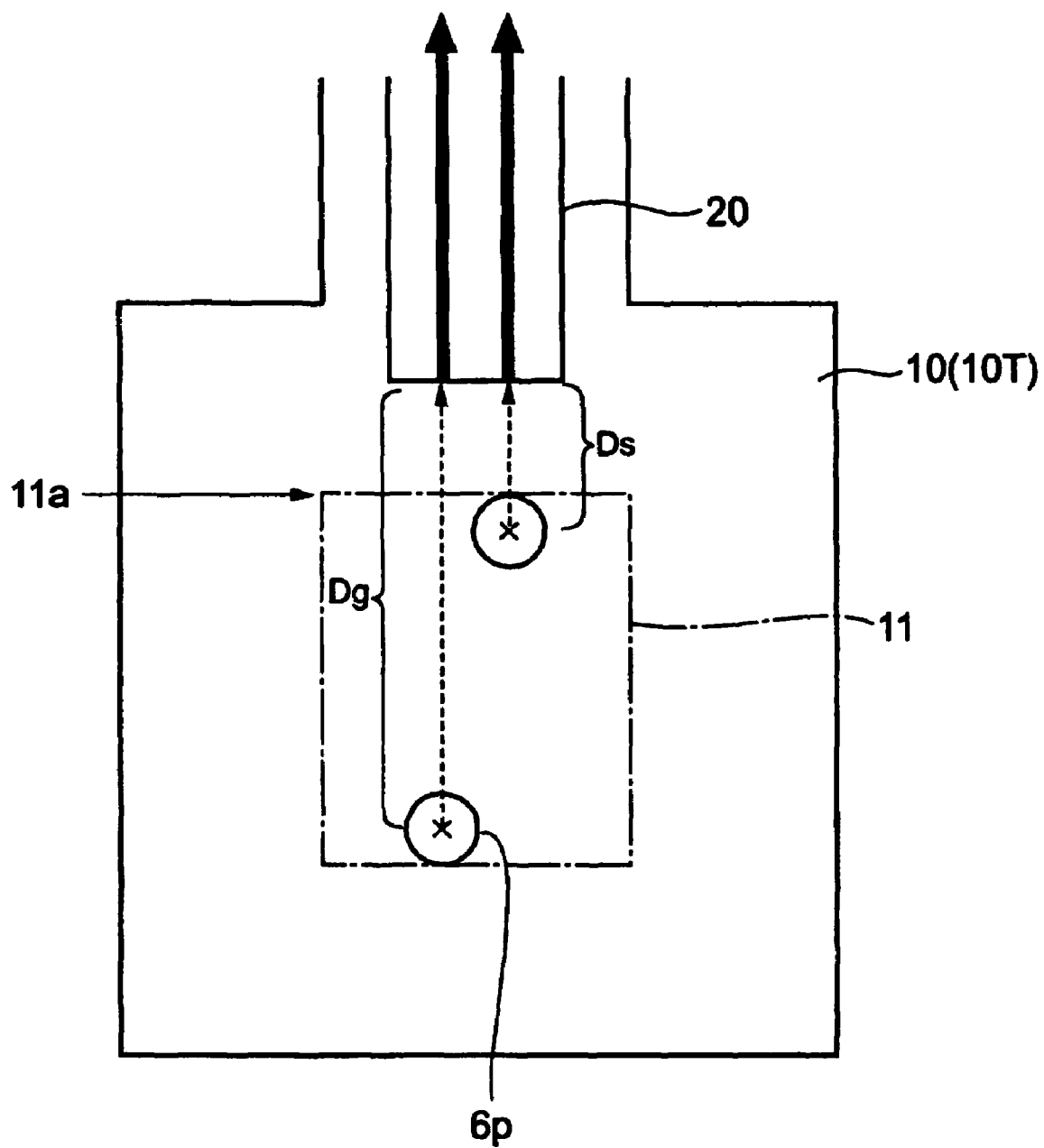
[Fig. 12]

ELECTRONIC APPARATUS WITH A WIRING TERMINAL

TECHNICAL FIELD

The present invention relates to an electronic apparatus provided with a wiring terminal. More specifically, the invention relates to an electronic apparatus comprising a wiring terminal for connecting to a terminal of peripheral circuitry. The invention particularly relates to an electronic apparatus such as a liquid crystal display device comprising that wiring terminal.

BACKGROUND ART

In electronic apparatuses such as liquid crystal display devices, there has been established a connecting technique of conductor patterns, which uses TAB (Tape Automated Bonding) and an anisotropic conductive film (hereinafter referred to as ACF) (see Non-patent Document 1, for instance).

In this technique, for example, an ACF is affixed to an electrode terminal of a liquid crystal panel and a chip connection terminal in a tape fragment on which a driver IC chip for the panel is mounted and then the panel electrode terminal and chip connection terminal undergo thermocompression bonding through the affixed ACF, whereby connection between these two terminals are accomplished. According to Non-patent Document 1, the panel electrode terminal is formed of aluminum or ITO (Indium Tin Oxide), while the chip connection terminal is formed of copper.

However, apart from the fact that forming a panel electrode terminal out of aluminum results in an advantage of reducing the electric resistance of the terminal, such an aluminum terminal has a drawback that the terminal can be easily subject to corrosion such as rust. In addition, although forming a panel electrode terminal out of ITO results in an advantage of enhancing chemical stability of the terminal, i.e. resistance to corrosion such as rust, such an ITO terminal has a drawback that its resistivity is higher than those of typical metals having been used as suitable conductors.

The panel electrode terminal and chip connection terminal form their electrical connection by means of the ACF, in which the ACF itself has an insulating material as a parent matter and a multiple conductive particles dispersed and mixed in the material, and conducting paths are formed between the terminals by only some particles that are sandwiched between the terminals while being in physically contact with the terminals, among all the conductive particles. However, since dispersiveness of the conductive particles in the insulating material is not strictly uniform and varies, positions of the conductive particles in contact with the terminals are also uneven. In other words, there is a possibility that short conducting paths are formed between some twos of the terminals, while long conducting paths are formed between other twos of the terminals. The electrical resistances of the terminal connection portions thereby can vary, and despite signals with the same levels being transmitted from the chip side, the panel side may receive signals with different levels and be brought into different driving states.

[Non-patent Document 1]
Yasoji Suzuki, 'Introduction to Liquid Crystal Display Engineering', NIKKAN KOGYO SHINBUN, LTD, Nov. 20, 1998, First edition, pages 42 to 46

DISCLOSURE (Object)
An object of the invention is to provide a terminal structure which can reduce a contact resistance and prevent corrosion and to provide an electronic apparatus based on the terminal structure.

The other object of the invention is to provide a terminal structure which can reduce variations of conducting paths formed by conductive particles of an anisotropic conductive film in the case where the anisotropic conductive film is made to intervene between a wiring terminal of the electronic apparatus and a terminal of the peripheral circuitry to connect them and which can present connection resistances as uniform as possible, and to provide an electronic apparatus based on the terminal structure.

A further object of the invention is to provide a terminal structure which provides reduction of a connection resistance and avoidation of corrosion and which can suppress variations of connection resistances, and to provide an electronic apparatus based on the terminal structure.

A still further object of the invention is to realize a low connection resistance and prevention of corrosion of terminals and suppression of variations of connection resistances, and to provide a terminal structure which is suitable for such an electronic apparatus as a liquid crystal display device that requires a lot of terminals to be formed in a small area and to provide an electronic apparatus based on the terminal structure.

(Constitution)
1) In order to achieve the objects, an electronic apparatus according to an aspect of the invention is an electronic apparatus comprising a conductive layer supported by a substrate and a metal layer of a material having a resistivity lower than that of the conductive layer, the metal layer being extended on the conductive layer, the conductive layer having an oxidation resistivity higher than that of the metal layer and forming a terminal for connecting to peripheral circuitry, wherein:

the metal layer extends on an extending portion of the conductive layer outside the terminal of the conductive layer, and/or on the periphery of or in the vicinity of a coupling area for making the conductive layer to be exposed to the exterior within an area of the terminal of the conductive layer; and there is provided an electrically insulating layer which covers at least a part of the terminal of the conductive layer and the whole of the metal layer and which extends on the area other than the coupling area within the area of the terminal of the conductive layer.

2) An electronic apparatus according to another aspect of the invention is an electronic apparatus comprising a conductive layer supported by a substrate and a metal layer of a material having a resistivity lower than that of the conductive layer, the metal layer being extended on the conductive layer, the conductive layer having an oxidation resistivity higher than that of the metal layer and forming a terminal for connecting to peripheral circuitry, wherein: the metal layer extends in the vicinity of or along exclusively an edge of a coupling area extending substantially in parallel to a lineup direction of the terminals and/or an edge of the coupling area extending substantially at a right angle with the lineup direction, the coupling area being for making the conductive layer to be exposed to the exterior in an area of the terminal of the conductive layer; and there is provided an electrically insulating layer which covers at least a part of the terminal of the conductive layer and at least a main portion of the metal layer and which extends on the area other than the coupling area in an area of the terminal of the conductive layer.

3) In these aspects, the conductive layer may be connected to a terminal of peripheral circuitry via an anisotropic conductive film in the coupling area.

By doing so, the metal layer with a low resistivity reduces the connection resistance of the conductive layer with a high resistivity, and at least a main portion of the corrosion-prone metal layer is protected by the insulating layer. Further, the coupling area exposed to the outside is formed of the conductive layer resistant to corrosion. Accordingly, it is possible to prevent the wiring terminal from corroding even when some time has elapsed before connecting the terminal of peripheral circuitry and the wiring terminal of the conductive layer, while reducing the connection resistance. Further, as derived from aspects 1) and 2), by adopting the form in which the metal layer extends at least on the periphery or in the vicinity of the coupling area, it is possible to regulate the distance of a conducting path which reaches the nearest portion of the metal layer from a position of the conductive layer at which a conductive particle of the anisotropic conductive film for practically connecting the terminals is in contact with the conductive layer in the coupling area, and to suppress variations of conducting paths, thus contributing to uniformalization of connection resistances.

In aspect 1) as described above, in addition to the basic features of the invention for reducing the resistance by the metal layer, protecting the metal layer by the insulting layer and forming the exposed coupling area by the conductive layer, the entire metal layer is covered with the insulating layer, whereby any surface of the metal layer is not exposed to ambient air, and it is thereby possible to thoroughly prevent the metal layer from corroding.

In aspect 2) as described above, in addition to the basic features, the metal layer does not surround the entire coupling area, and only extends in the vicinity of or along an edge of the coupling area extending substantially in parallel to a lineup direction of the terminals and/or an edge of the coupling area extending substantially at a right angle with the lineup direction, and it is thereby possible to reduce an area necessary for the terminals and decrease a pitch between the terminals.

4) Further, in the aforementioned aspects, it is preferable that the metal layer is formed to surround the coupling area in an area of the terminal of the conductive layer. By this means, distances of conducting paths afforded by conductive particles as described above are regulated more strongly, and the connection resistances are further uniformalized.

5) Furthermore, it is preferable that the coupling area is formed in a shape including at least one linear edge on its plan view, and the metal layer is formed along the linear edge in an area of the terminal of the conductive layer. It is thereby possible to have an advantage in efficiently using the area of the terminal of the longitudinally extending conductive layer.

6) In the aforementioned aspects, the insulating layer may include a first insulating layer which has been patterned together with the metal layer and is stacked on the metal layer, and a second insulating layer which covers at least a part of the first insulating layer having been patterned and a side of the metal layer. In this way, the second insulating layer is able to cover exposure of the side of the metal layer which is likely caused when the metal layer and the insulating layer stacked on the metal layer are patterned at the same time, and it is thus possible to thoroughly prevent the metal layer from being exposed after forming the terminal structure.

7) Further, in the aforementioned aspects, it is preferable that the conductive layer, the metal layer and/or the insulating layer are/is in the same layer as in those/that of a conductive film, a metal film and/or an insulating film, respectively, used for a display element or driving element formed in the electronic apparatus. According to such an embodied form, it is possible to form the conductive layer, the metal layer and/or the insulating layer in the same processes as those of the main structural portion of the electronic apparatus without increasing any additional processes for the conductive layer, the metal layer and/or the insulating layer, whereby it is possible to simplify the manufacturing process and contribute to reduction in manufacturing and product costs.

DESCRIPTION OF DRAWINGS

FIG. 1 is a schematic plan view showing a structure of terminals of an electronic apparatus according to one embodiment of the invention;

FIG. 2 is a schematic cross-sectional view of the terminals, which is obtained by taking the structure shown in FIG. 1 along a II-II line;

FIG. 3 is a schematic illustration showing forms of conducting paths provided in the terminal structure shown in FIGS. 1 and 2;

FIG. 4 is a schematic illustration showing a comparison example for description as compared with the forms of FIG. 3;

FIG. 5 is a plan view showing a combination of a liquid crystal panel and a film substrate for TAB in a liquid crystal display apparatus to which the embodiment of the invention is applied;

FIG. 6 is a schematic cross-sectional view showing relations between a pixel unit and a terminal structure in the case where the invention is applied to a liquid crystal display apparatus;

FIG. 7 is a schematic cross-sectional view showing other relations between a pixel unit and a terminal structure in the case where the invention is applied to a liquid crystal display apparatus;

FIG. 8 is a schematic plan view showing a structure of terminals of an electronic apparatus according to the other embodiment of the invention;

FIG. 9 is a schematic cross-sectional view of the terminals, which is obtained by taking the structure shown in FIG. 8 along a IX-IX line;

FIG. 10 is a schematic illustration showing forms of conducting paths provided in the terminal structure shown in FIGS. 8 and 9;

FIG. 11 is a schematic illustration showing a terminal structure according to a modification and forms of conducting paths presented by the structure; and FIG. 12 is a schematic illustration showing a terminal structure according to a further modification and forms of conducting paths presented by the structure.

BEST MODE

Now embodied forms of the present invention will be described in more detail with respect to embodiments with reference to accompanying drawings.

FIG. 1 shows a plane structure of terminals of an electronic apparatus according to one embodiment of the invention, and FIG. 2 shows a cross section of the terminals taken along a line II-II in the structure shown in FIG. 1.

This electronic apparatus comprises a transparent conductive layer 10 supported by a substrate 8, and a metal layer 20 which extends on the transparent conductive layer 10 and is formed of a material having an electrical resistivity lower than that of the transparent conductive layer 10. The transparent conductive layer 10 forms a terminal (area) connected to peripheral circuitry in its end portion in this embodiment. The substrate 8 is, for example, a glass substrate as a rear substrate located opposed to a display surface when the electronic apparatus is a liquid crystal display device as described later. The transparent conductive layer 10 longitudinally extends from the main structural part (abbreviated in FIG. 1) of the electronic apparatus to a terminal 10T of the main part, and the terminal portion 10T is formed larger in width than the longitudinal extending portion 10L. The transparent conductive layer 10 is formed of a material such as ITO which is chemically stable and has high resistance to corrosion such as rust. More specifically, used as a material of the transparent conductive layer 10 may be a material having higher oxidation resistance than that of the metal layer 20, and more preferably a material which remains stable and is not oxidized from a point in time an exposed terminal is formed by the transparent conductive layer until a point in time an ACF is affixed to the terminal to seal. In manufacturing a liquid crystal display device, a duration from forming the terminal to affixing the ACF actually takes several months, or may takes over twelve months in a late case. Therefore, it is preferable that the layer 10 has oxidation resistance properties such that adequate electrical connection is obtained between the layer 10 and an external terminal even when connection is made between them via an ACF after a lapse of such a long duration. The metal layer 20 is formed of MoCr having a resistivity lower than that of ITO in this embodiment, but may be formed of Al.

In the electronic apparatus, the metal layer 20 extends from the main part of the electronic apparatus to the terminal 10T in a fashion similar to the transparent conductive layer 10, while extending on the periphery or in the vicinity of a coupling area 11 where the transparent conductive layer 10 is exposed to the outside in the area of the terminal 10T of the transparent conductive layer 10, and in this embodiment, extending making a round of the area 11 to surround.

The terminal structure is further provided with an electrically insulating layer 30 that is one of features of this embodiment. The insulating layer 30 covers at least a part of the terminal 10T of the transparent conductive layer 10 and the whole metal layer 20, particularly, even a side 21 as well as the top, and extends in the area of the terminal 10T of the transparent conductive layer 10 except the coupling area 11. The coupling area 11 is delimited by sides 31 of the insulating layer 30. As a material of the insulating layer 30, silicon nitride (SiNx) is used in this embodiment, but other materials such as synthesis resins having electrical insulation properties may be used.

Meanwhile, a second substrate 50 that carries a terminal 40 to be connected to the terminal 10T is arranged opposite to the substrate 8 provided with the wiring terminal structure. The substrate 50 is a film substrate, and is separated from a tape-shaped film generally for use in TAB techniques, for example, polyimide-based film. The terminal 40 is in this embodiment a front end portion of a conductor pattern (track) derived from a terminal of an IC chip, not shown, as a peripheral circuit mounted on the substrate 50, and is formed of a material such as copper. Further, the chip-derivation terminals 40 are disposed to face the corresponding terminals 10T on the side of the opposite substrate 8, respectively, more specifically, to face the coupling area 11 frontally.

The transparent conductive layer 10 is connected to the terminal 40 of the above-mentioned peripheral circuit via an anisotropic conductive film (ACF) 60 in the relevant coupling area 11 of the terminal 10T. As its outline is shown by the dotted lines in FIG. 1, the anisotropic conductive film 60 extends in a transversal direction at right angles to a direction in which the transparent conductive layer 10 extends, and is present between the terminals 10T and 40 to cover the whole areas of both the terminals.

The situation of connection between the terminals using the ACF 60 will be descried below.

As shown in FIG. 2, conductive particles 6p dispersed and mixed in the ACF 60 are sandwiched between the terminal 40 of the film substrate 50 and the coupling area 11 of the terminal 10T of the substrate 8 while being in contact with both terminals without no space when the ACF 60 is sandwiched between the film substrate 50 and the substrate 8. In other words, the particles touch the both terminals in a region where the area of the terminal 40 overlaps the coupling area 11 of the terminal 10T, and so electrical connection is made between their toughing positions. On the other hand, in areas except the overlapping region, such electrical connection is not made, and the electrical isolation will be held against the overlapping region.

FIG. 3 more specifically illustrates the connection based on the conductive particles according to this embodiment, and schematically shows conducting paths provided between a pair of the upper and lower terminals 40 and 10T.

When the ACF 60 is sandwiched between the film substrate 50 and the substrate 8 under the aforementioned terminal structure, the conductive particle 6p in contact with the terminal 40 on the film substrate 50 side is forced to come into contact with the transparent conductive layer 10 within the coupling area 11 on the substrate 8 side. As shown in FIG. 3, when contact points of the conductive particles 6p with the terminal 40 and the transparent conductive layer 10 are represented by crosses, conducting paths formed by the conductive particles 6p on the terminal 10T side consist of conducting paths in the transparent conductive layer 10 as shown by the dotted arrows in FIG. 3 and the following conducting paths in the metal layer 20 as shown by the bold arrows in FIG. 3. Since the metal layer 20 has a resistivity substantially lower than that of the transparent conductive layer 10, a conducting path formed herein can generally be considered as being formed in a direction in which a contact point of the conductive particle 6p is connected to a portion of the metal layer 30 nearest to the contact point.

The longest conducting path in the transparent conductive layer 10 is generally obtained in a state where a conductive particle 6p is in contact with the transparent conductive layer 10 in the center of the coupling area 11. Accordingly, by the neglect of the conducting paths caused by the metal layer 30 with sufficiently low resistivity, the longest conducting path that may be provided by the conductive particles 6p in the terminal in this structure is generally estimated to have a distance Dg from the center of the coupling area 11 to the nearest edge of the metal layer 30. Further, the shortest conducting path that may be caused by the conductive particles 6p in the terminal is generally estimated to have a distance Ds from the contact point of a conductive particle 6p present in contact with an edge of the coupling area 11 to the nearest edge of the metal layer 30. Therefore, variations in conducting paths the conducting particles 6p can provide fall within a range of a difference between these distances i.e. a value of Vo=Dg−Ds. The range of the variations can be more decreased, as the coupling area 11 is more narrowed.

In contrast thereto, in a comparison example with the structure as shown in FIG. 4, such a range of variations is large. In other words, the comparison example in FIG. 4 is intended not to have the metal layer 20 but to make electrical connection of the opposite terminal 40 only with the transparent conductive layer 10, variations of conducting paths from contact points of the conductive particles 6p are in a wide range even if the coupling area 11 is formed equal to that in FIG. 3 as shown in FIG. 4. For example, assuming that an edge 11a of the coupling area 11 on the longitudinal extending portion 10L of the transparent conductive layer is regarded as a reference, a difference between a distance ds and a distance dg is larger than the value of Vo described above, where the distance ds is a distance from a contact point of a conductive particle 6p present in contact with the edge 11a to the edge 11a, which is assumed to provide the shortest conducting path, and the distance dg is a distance from a contact point of a conductive particle 6p present in contact with an edge 11b on the opposite side to the edge 11a to the edge 11a, which is assumed to provide the longest conducting path.

As can be seen compared with the comparison example, according to the embodiment, the metal layer 20 with a relatively low resistivity is stacked on the transparent conductive layer 10 around the coupling area 11, and it is thereby achieved that lengths of possible conducting paths are restricted to be short, and that variations in the conducting paths are suppressed. Further in this embodiment, since the metal layer is laid to surround the coupling area, it is possible to more effectively suppress the variations in the conducting paths.

Furthermore, the embodiment is intended not to have conductive particles 6p of the ACF make contact with the metal layer 20 of a low resistivity on purpose, but to have them come into contact with the coupling area 11 that is an exposed surface of the transparent conductive layer 10 of a high resistivity but of a high chemical stability, whereby it is also realized to prevent the terminal from corroding even after a lapse of long time before the coupling area 11 is sealed with an ACF, for example.

In addition, the metal layer stacked on the transparent conductive layer provides advantages not only in reducing lengths and variations of conducting paths in the terminal, but also in decreasing an electrical resistance of the terminal and the whole conductor wiring, regardless of whether the metal layer exists inside or outside the terminal area.

FIG. 5 shows an example where the aforementioned terminal connection structure is applied to a liquid crystal display device.

In FIG. 5, there is depicted a connection situation of electrode terminals derived from a liquid crystal panel 100 forming an image display region mainly in a liquid crystal display device and terminals of the film substrate 50 for TAB, which are connected to the electrode terminals. The liquid crystal panel 100 is provided with a plurality of pixel (display) elements which are arranged, for example, in the form of a matrix in the display region and individually perform optical modulation according to pixel information to be displayed. This example illustrates an active matrix type panel for the liquid crystal panel 100, and each pixel unit is provided with an individual pixel electrode 101 constituting the pixel element, and TFT (Thin Film Transistor) 102 as an active element or driving element for providing the pixel electrode with an electric potential according to the pixel information.

Gate electrodes of the TFTs 102 are commonly connected for each row by a longitudinal electrical conductor as a row line or a gate connection line, and the gate connection lines extend in the horizontal direction on the display screen and form the terminals 10T as described above in a region on the external edge side of the panel 100, in this example, in the left side region of the screen. Similarly, source electrodes of the TFTs 102 are also commonly connected for each column by a longitudinal electrical conductor as a column line or a source connection line, and the source connection lines extend in the vertical direction on the display screen and form the terminals 10T as described above in a region on the external edge side of the panel 100, in this example also in the left side region of the screen.

The film substrate 50 fixed with ICs for TAB is fixed on the liquid crystal panel 100. The film substrate 50 is provided with a so-called source driver IC chip 51 as a column driving circuit to supply suitable pixel information signals to the source connection lines, and a so-called gate driver IC chip 52 as a row driving circuit to supply suitable gate control signals to the gate connection lines, as peripheral circuitry of the liquid crystal display device. On the film substrate 50, conductor patterns respectively connected to terminals of the IC chips 51 and 52 are formed, the conductor patterns forming the peripheral circuitry terminals 40 as described above on the external edge side of the film substrate, in this example, in the right side region of the film substrate so as to make electrical connection with the terminals 10T of the liquid crystal panel 100.

The terminals 10T on the liquid crystal panel 100 side and the terminals 40 on the film substrate 50 side are aligned with each other as shown in FIGS. 2 and 5 after affixing the ACF 60 to either the terminals 10T or 40, and are subjected to thermocompression bonding to make electrical connection based on conductive particles in the ACF as described above.

FIG. 6 shows a relationship between the above-mentioned structural elements of the pixel electrode 101 and TFT 102 and the terminal structure.

In FIG. 6, the TFT 102 comprises source and drain electrodes 71 and 72 formed on the substrate 8 and a semiconductor layer 73 formed to bridge the electrodes 71 and 72 in contact with both. The source electrode 71 is comprised of a transparent conductive film 7t and a metal film 7m stacked on the film 7t. The semiconductor layer 73 is covered with a gate insulating film 74, and a gate electrode 75 is stacked on the layer 74. An electrically insulating layer 76 is formed as a protecting layer to cover the whole of the structural elements 71 to 75. The drain electrode 72 further extends outward to form the pixel electrode 101. The transparent conductive film 7t and the drain electrode 72 (pixel electrode 101) are formed concurrently patterned and formed using the same material.

It is noted that the transparent conductive film 7t and the metal film 7m constituting the source electrode 71 are patterned concurrently with the transparent conductive layer 10 and the metal layer 20 in the terminal structure described earlier, respectively, and the gate insulating film 74 is also patterned concurrently with the insulating layer 30. By this manner, it is possible to form the transparent conductive layer, the insulating layer and/or the metal layer in the same processes as those of the TFT 102 that is a main structural part of the electronic apparatus without increasing additional processes for the transparent conductive layer 10, the insulating layer 30 and/or the metal layer 20, whereby it leads to simplification oft he manufacturing process and contribution to reduction in manufacturing and product cost.

FIG. 6 shows an example where the metal layer 20 and the insulating layer 30 are formed in different pattern formation processes, but there is the case where these layers may be subjected to simultaneous pattern formation. In this case, as shown in FIG. 7, the side 21 of the metal layer 20 will be exposed, which is not preferable from the viewpoint of fully preventing corrosion. Therefore, also as shown in FIG. 7, for example, a gate insulating film 74 of the TFT 102 is used for a first insulating layer 3a for the terminal, and a gate protecting layer 76 is used for a second insulating layer 3b for the terminal, the first and second insulating layers 3a and 3b being used as the insulating layer 30 to cover the entire metal layer 20. Also in this example, since the both insulating layers are formed in the same layer as that of the insulating film used in the TFT 102, similar simplification of process is obtained.

Another embodiment of the invention will be described below.

FIG. 8 shows a plane structure of terminals of an electronic apparatus according to the embodiment of the invention, and FIG. 9 shows a cross-section obtained by taking along the line IX-IX in the structure shown in FIG. 8.

In this embodiment, as distinct from the embodiment described earlier, the metal layer 20 does not have a pattern extending round the coupling area 11 to surround, but extends in the vicinity of one edge 11a extending substantially in parallel to a lineup direction (lateral direction in FIG. 8) of the terminals 10T and in the vicinity of an edge 11c extending substantially at right angles to the lineup direction (in this embodiment, along these edges), as it become apparent from FIG. 1.

By this means, the metal layer 20 extends only on one side in the terminal area and decreases the occupying area, and it is thus possible to decrease the terminal area without changing the area size of the coupling area 11. Accordingly, the distance between the terminals can be shortened, thus providing advantages to electronic apparatuses where a plurality of terminals should be formed and arranged in a small area.

FIG. 10 illustrates forms of conducting paths according to this embodiment, where the notation is the same as in FIG. 3. As is suggested from FIG. 10, even when part of the metal layer 20 surrounding the coupling area 11 is decreased to half, variations in conducting paths are suppressed correspondingly.

Although the metal layer 20 shown in FIGS. 8 and 9 is drawn along both edges, the horizontal edge 11a and vertical edge 11c of the coupling area in the terminal area, a form of the layer 20 extending along only either of the edges can obtain advantages specific to the invention. FIG. 11 shows the case where the metal layer 20 is formed only along the vertical edge 11c, in the similar way to FIG. 10. As can be seen from FIG. 11 by intuition, this example enables a pitch between the terminals to be further decreased, and variations in conducting paths are also further decreased.

FIG. 12 shows an example where the metal layer 20 is formed only along the horizontal edge 11a, also in the similar way to FIG. 10. In this example, the metal layer 20 extends immediately in front of the area of terminal 10T of the transparent conductive layer 10. Such a from also allows implementation of reliable protection of the metal layer 20 based on the second insulating layer as described with reference to FIG. 7, and it is effective as measures for increasing the terminal density.

In addition, as is apparent from the example in FIG. 11, the coupling area 11 does not need to be always located substantially in the center of the area of the terminal 10T of the transparent conductive layer 10, and may adopt any forms other than a rectangle as viewed on the plan view. Further, advantages in efficiently using the terminal area of the longitudinally extending transparent conductive layer 10 are produced in such a structure that the coupling area 11 is formed in a shape including at least one linear edge (11a, 11b or 11c) on its plan view, and the metal layer 20 is formed along the linear edge in an area of the terminal 10T of the transparent conductive layer 10.

The examples as described above adopt forms in which the metal layer 20 extends to enter the terminal area, but the metal layer 20 does not always need to enter the terminal area from the viewpoint where the metal layer 20 is entirely covered with the insulating layer 30, 3a or 3b to fully prevent the metal layer 20 from corroding. In the above-mentioned embodiments, it has been described that the transparent conductive layer 10 is a layer disposed under the metal layer 20, but such a layer 10 does not always need to be transparent, and may be a layer with any other properties, as long as the layer is suitable for an applied electronic apparatus and has oxidation resistance higher than that of the metal layer 20.

Representative embodiments according to the present invention has been described above, but it would be possible to modify the embodiments in various ways when necessary without departing from the scope of claimed inventions as described in claims to those skilled in the art.

INDUSTRIAL APPLICABILITY

The present invention is capable of being applied to an electronic apparatus provided with a wiring terminal to connect to peripheral circuitry.

The invention claimed is:

1. An electronic apparatus comprising;
a conductive layer having a top surface and a bottom surface, the bottom surface in at least partial contact with a substrate, the electronic apparatus further comprising a metal layer of a material having a resistivity lower than that of the conductive layer, the metal layer being extended on the top surface of the conductive layer, the conductive layer having an oxidation resistivity higher than that of the metal layer and forming a terminal for connecting to peripheral circuitry, wherein:
the metal layer extends on an extending portion of the top surface of the conductive layer outside the terminal of the conductive layer, and/or on the periphery of or in the vicinity of a coupling area for making the conductive layer to be exposed to the exterior within an area of the terminal of the conductive layer; and
there is provided an electrically insulating layer which covers at least a part of the terminal of the conductive layer and the whole of the metal layer and which extends on the area other than the coupling area within the area of the terminal of the conductive layer.

2. An electronic apparatus comprising:
a conductive layer having a top surface and a bottom surface, the bottom surface in at least partial contact with a substrate, the electronic apparatus further comprising a metal layer of a material having a resistivity lower than that of the conductive layer, the metal layer being extended on the top surface of the conductive layer, the conductive layer having an oxidation resistivity higher than that of the metal layer and forming a terminal for connecting to peripheral circuitry, wherein:
the metal layer extends in the vicinity of or along exclusively an edge of a coupling area extending substantially in parallel to a lineup direction of the terminals and/or an edge of the coupling area extending substantially at a right angle with the lineup direction, the coupling area being for making the conductive layer to be exposed to the exterior in an area of the terminal of the conductive layer; and
there is provided an electrically insulating layer which covers at least a part of the terminal of the conductive layer and at least a main portion of the metal layer and which extends on the area other than the coupling area in an area of the terminal of the conductive layer.

3. An electronic apparatus as defined in claim 1 or 2, wherein the conductive layer is connected to a terminal of peripheral circuitry via an anisotropic conductive film in the coupling area.

4. An electronic apparatus as defined in claim 1, wherein the metal layer is formed surrounding the coupling area in an area of the terminal of the conductive layer.

5. An electronic apparatus as defined in claim 1 or 2, wherein the coupling area is formed in a shape including at least one linear edge on its plan view, and the metal layer is formed along the linear edge in an area of the terminal of the conductive layer.

6. An electronic apparatus as defined in claim 1 or 2, wherein the insulating layer includes a first insulating layer which has been patterned together with the metal layer and is stacked on the metal layer, and a second insulating layer which covers at least a part of the first insulating layer having been patterned and a side of the metal layer.

7. An electronic apparatus as defined in claim 1 or 2, wherein the conductive layer, the metal layer and/or the insulating layer are/is in the same layer as in those/that of a conductive film, a metal film and/or an insulating film, respectively, used for a display element or driving device formed in the electronic apparatus.

* * * * *